(12) United States Patent
Apalkov et al.

(10) Patent No.: US 8,248,100 B2
(45) Date of Patent: Aug. 21, 2012

(54) METHOD AND SYSTEM FOR PROVIDING SPIN TRANSFER BASED LOGIC DEVICES

(75) Inventors: Dmytro Apalkov, San Jose, CA (US); David Druist, Santa Clara, CA (US)

(73) Assignee: Grandis, Inc., Milpitas, CA (US)

( * ) Notice: Subject to any disclaimer, the term of this patent is extended or adjusted under 35 U.S.C. 154(b) by 0 days.

(21) Appl. No.: 13/089,605

(22) Filed: Apr. 19, 2011

(65) Prior Publication Data

US 2011/0254585 A1  Oct. 20, 2011

Related U.S. Application Data

(60) Provisional application No. 61/325,464, filed on Apr. 19, 2010.

(51) Int. Cl.
*G06F 7/38* (2006.01)
*H01L 25/00* (2006.01)

(52) U.S. Cl. ............... 326/37; 326/38; 326/41; 326/47; 326/101

(58) Field of Classification Search ............. 326/37–41, 326/47, 101
See application file for complete search history.

(56) References Cited

U.S. PATENT DOCUMENTS

| | | | | |
|---|---|---|---|---|
| 6,061,210 A | * | 5/2000 | Gill | 360/324.12 |
| 6,771,534 B2 | * | 8/2004 | Stipe | 365/158 |
| 8,133,439 B2 | * | 3/2012 | Wang et al. | 422/68.1 |
| 2005/0104101 A1 | * | 5/2005 | Sun et al. | 257/295 |
| 2005/0174702 A1 | * | 8/2005 | Gill | 360/324.2 |
| 2008/0032423 A1 | * | 2/2008 | Wang et al. | 436/536 |

OTHER PUBLICATIONS

Behin-Aein, et al., "Proposal for an All-Spin Logic Device with Built-In Memory", Nature Nanotechnology, DOI:10.1038 (2010).
PCT International Search Report and Written Opinion of the ISA, application No. PCT/US08/64794.
PCT International Search Report and Written Opinion of the ISA, application No. PCT/US08/66369.
PCT International Search Report and Written Opinion of the ISA, application No. PCT/US10/647941.
PCT International Search Report and Written Opinion of the ISA, application No. PCT/US10/59184.
Office Action issued Apr. 2008 for U.S. Appl. No. 11/239,939.
Office Action issued Sep. 2008 for U.S. Appl. No. 11/239,939.
Office Action issued Jan. 2001 for U.S. Appl. No. 12/133,671.
Office Action issued Apr. 2009 for U.S. Appl. No. 12/133,671.
Office Action issued Mar. 2011 for U.S. Appl. No. 12/638,902.

* cited by examiner

*Primary Examiner* — Shawki S Ismail
*Assistant Examiner* — Thienvu Tran
(74) *Attorney, Agent, or Firm* — Convergent Law Group LLP

(57) ABSTRACT

A method and system for providing a logic device are described. The logic device includes a plurality of magnetic input/channel regions, at least one magnetic sensor region, and at least one sensor coupled with the at least one magnetic sensor region. Each of the magnetic input/channel regions is magnetically biased in a first direction. The magnetic sensor region(s) are magnetically biased in a second direction different from the first direction such that at least one domain wall resides in the magnetic input/channel regions if the logic device is in a quiescent state. The sensor(s) output a signal based on a magnetic state of the magnetic sensor region(s). The input/channel regions and the magnetic sensor region(s) are configured such that the domain wall(s) may move into the magnetic sensor region(s) in response to a logic signal being provided to at least a portion of the magnetic input regions.

22 Claims, 13 Drawing Sheets

METHOD AND SYSTEM FOR PROVIDING SPIN TRANSFER BASED LOGIC DEVICES

CROSS-REFERENCE TO RELATED APPLICATIONS

This application claims the benefit of Provisional Patent Application Ser. No. 61/325,464, filed Apr. 19, 2010, entitled METHOD AND SYSTEM FOR PROVIDING SPIN TRANSFER BASED LOGIC ELEMENTS, assigned to the assignee of the present application, and incorporated herein by reference.

BACKGROUND OF THE INVENTION

Logic gates are used to perform various logic operations, most notably AND, OR, NAND, and NOR. Typically, a single logic gate is made of several components which together provide a logic operation. For example, an AND gate includes components which together provide an AND operation. Further, logic devices are desired to have various characteristics. For example, logic devices are generally desired to be concatenatable and nonlinear. A logic device is concatenatable if the output of the logic device may be provided to the input of another logic device. Nonlinearity corresponds to the response of the logic device having two states based on the input. A logic device may thus allow the digitization of analog information. Further, the logic device is desired to be free of feedback. Thus, the output of the logic device should not affect the inputs if the output is not intentionally fed back to the input. Gain in a logic device is desired to allow a sufficient output signal using the supply voltage of the circuitry. Finally, a set of logic devices built on a particular technology is desired to provide a full set of Boolean operations. For example, at least a NOT operation and an AND operation may desired. Other operations may be formed either from the basic components of the technology or from the NOT and AND gates. Finally, the logic devices are desired to be sufficiently fast, not consume an undue amount of energy and be manufacturable at desired densities.

FIG. 1 depicts a conventional magnetic switch 10, which may be considered a conventional magnetic logic gate. The conventional magnetic switch 10 includes contacts 12, 20, 22, and 30, free layer 14 and 24, barriers 16, 18, 26, and 28, isolation layers 17 and 27, and channel 30. Depending upon the value of the voltage $V_{supply}$, the spins in the channel 40 may be in one of two states. The free layer 24 magnetization may then be in one of two states. These states can be determined on the output voltage, $V_{out}$. Thus, the structure 10 may function as a switch. However, the conventional magnetic switch 10 may not be easily used to generate other logic gates having the desired characteristics. For example, the current through the conventional magnetic switch 10, switching speed, ease of fabrication and other issues may prevent the conventional magnetic switch 10 from use in logic devices.

Accordingly, what is needed is a method and system that may allow for magnetic logic gates. The method and system described herein address such a need.

BRIEF SUMMARY OF THE INVENTION

A method and system for providing a logic device are described. The logic device includes a plurality of magnetic input/channel regions, at least one magnetic sensor region, and at least one sensor coupled with the at least one magnetic sensor region. Each of the magnetic input/channel regions is magnetically biased in a first direction. The magnetic sensor region(s) are magnetically biased in a second direction different from the first direction such that at least one domain wall resides in the magnetic input/channel regions if the logic device is in a quiescent state. The sensor(s) are for outputting a signal based on a magnetic state of the magnetic sensor region(s). The input/channel regions and the magnetic sensor region(s) are configured such that the domain wall(s) may move into the magnetic sensor region(s) in response to a logic signal being provided to at least a portion of the magnetic input regions.

DETAILED DESCRIPTION OF THE INVENTION

Figure 1:
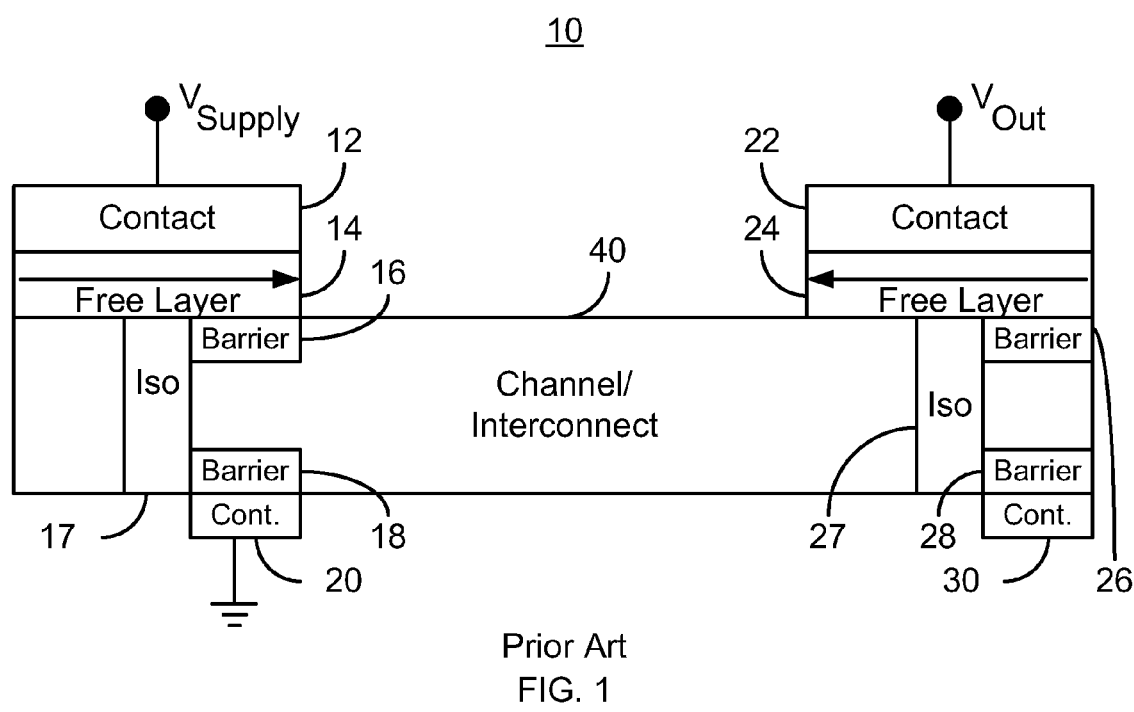
FIG. 1 depicts a conventional magnetic switch.

The exemplary embodiments relate to logic elements based on magnetic elements using spin transfer torque switching. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular magnetic elements having certain components. One of ordinary skill in the art will readily recognize that the present invention is consistent with the use of magnetic elements having other and/or additional components and/or other features not inconsistent with the present invention. The method and system are also described in the context of current understanding of the spin transfer phenomenon. Consequently, one of ordinary skill in the art will readily recognize that theoretical explanations of the behavior of the method and system are made based upon this current understanding of spin transfer. Furthermore, the method and system are described in the context of structures having particular layers. However, one of ordinary skill in the art will readily recognize that structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single structures. However, one of ordinary skill in the art will readily recognize that the method and system are consistent with the use of multiple elements. Further, as used herein, "in-plane" is substantially within or parallel to the plane of one or more of the layers of a magnetic element. Conversely, "perpendicular" corresponds to a direction that is substantially perpendicular to one or more of the layers of the magnetic element.

A method and system for providing a logic device are described. The logic device includes a plurality of magnetic input/channel regions, at least one magnetic sensor region, and at least one sensor coupled with the at least one magnetic sensor region. Each of the magnetic input/channel regions is magnetically biased in a first direction. The magnetic sensor region(s) are magnetically biased in a second direction different from the first direction such that at least one domain wall resides in the magnetic input/channel regions if the logic device is in a quiescent state. The sensor(s) are for outputting a signal based on a magnetic state of the magnetic sensor region(s). The input/channel regions and the magnetic sensor region(s) are configured such that the domain wall(s) may move into the magnetic sensor region(s) in response to a logic signal being provided to at least a portion of the magnetic input regions.

Figure 2:
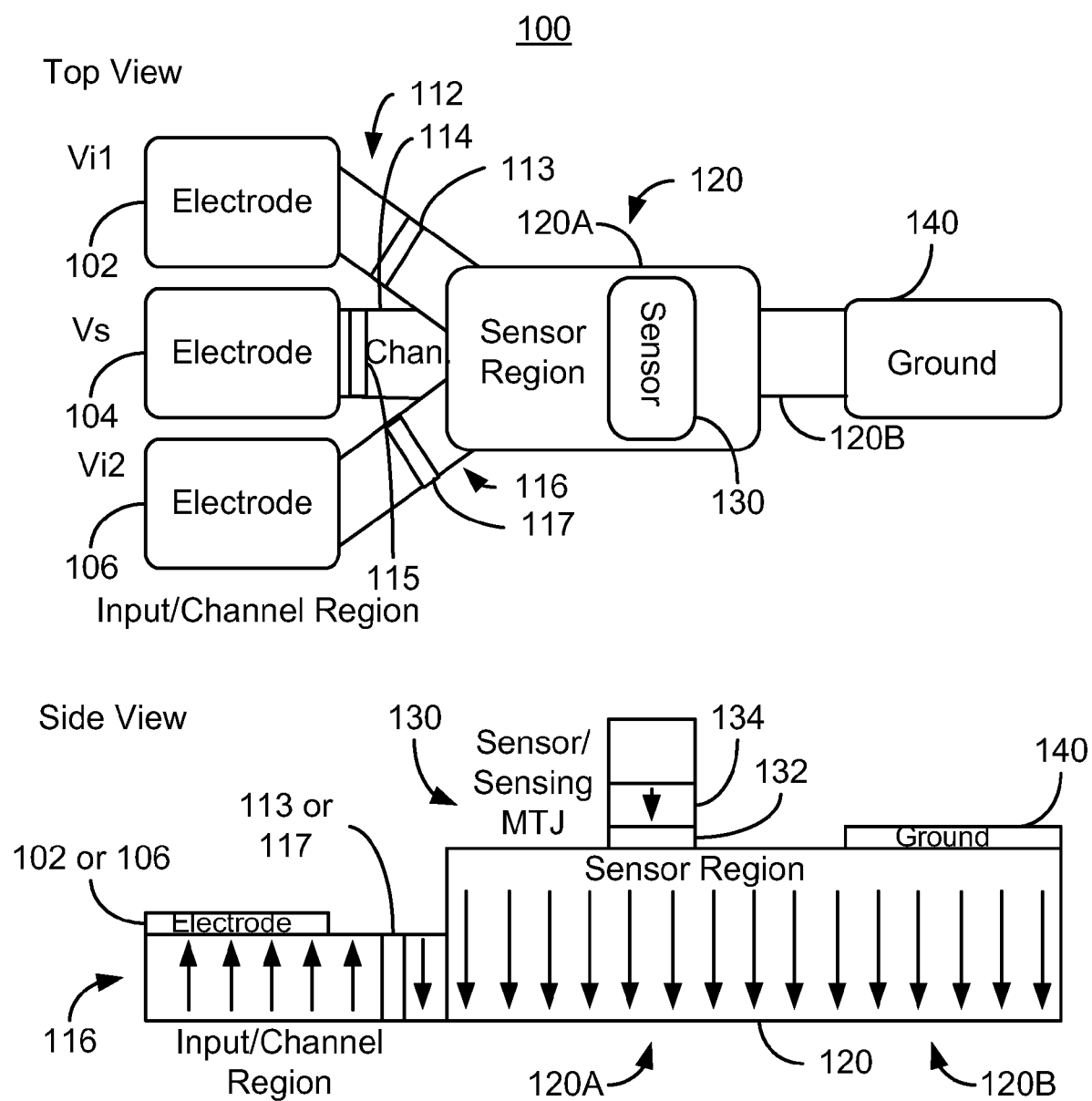
FIG. 2 depicts an exemplary embodiment of a magnetic logic device.

FIG. 2 depicts plan (top) and side views of an exemplary embodiment of a logic device 100 based on spin transfer torque. In particular the logic device shown includes three inputs, termed input electrodes in FIG. 1, that correspond to input/channel regions 112, 114, and 116, a sensor 130, a sensor region 120, and a ground electrode 140. The input electrodes 102, 104, and 106 are for inputting voltages Vi1, Vi2, and Vs to input/channel regions 112, 114, and 116, respectively. Vi corresponds to an input voltage, while Vs is a bias voltage that may be provided to the input electrode. In other embodiments, another number of input electrodes may be provided and/or Vs may be an input voltage instead of a bias voltage. Further, the electrode to which the bias voltage need not be the electrode 104, but instead might be the electrode 102 or 106. The ground electrode 140 connects the device 100 to ground and allows for current to flow to ground.

Below the input electrodes 102, 104, and 106 are magnetic input/channel regions 112, 114, and 116, respectively. A portion of the input/channel regions 112, 114, and 116 also extends out from the electrodes 102, 104, and 106, respectively, to the sensor region 120. The magnetic input region/channel region may thus be considered to be divided into an input region directly below the electrode and a channel region that extends to the sensor region 120.

The sensor 130 shown is a magnetic tunneling junction (MTJ) including a nonmagnetic tunneling barrier layer 132 and a pinned layer 134. The sensor region 120 may be seen to function as a free layer for the MTJ 130. The output of the sensor 130 thus changes depending upon the orientation of the sensor region 120. Note that the sensor 130 may have other configurations that are sensitive to the orientation of the sensor region 120.

Below the sensor 130 and ground 140 is a magnetic sensor region 120. The magnetic sensor region 120 may be considered to have two portions of different widths, 120A and 120B. A portion of the magnetic moments of the input/channel region 112, 114, and 116 may be set to a first orientation, while the magnetic moments of the sensor region 120 and a remaining portion of the input region (if any) are set to a second orientation. As a result, a domain wall 113, 115, and 117 may reside somewhere in the magnetic input/channel region 112, 114, and 116, respectively, when the logic device 100 is in a quiescent state. Stated differently, a domain wall 113, 115, and 117 may reside somewhere in the magnetic input/channel region 112, 114, and 116, respectively, when no logic signals are provided to the logic device 100. In the embodiment shown, the input/channel regions 112, 114, and 116 are initially oriented up (until domain walls 113, 115, and 117, respectively), while the sensor region 120 is oriented down. In other embodiments, the orientation may be different. For example, orientations that are at least partially in plane may be used. However, what is desired is that the initial/quiescent orientation of the magnetic moments in at least part of the input/channel region 112, 114, and 116 be different from the orientation of the magnetic moments in the sensor region 120. Thus, the domain walls 113, 115, and 117 reside in the input region/channel regions 112, 114, and 116, respectively corresponding to each input electrode 102, 104, and 106, respectively. The magnetic moments of the input/channel regions 112, 114, and 116 and the sensor region 120 might be stabilized in a number of ways. For example, antiferromagnetic material(s) (not shown) may be placed in proximity to portions of the input/channel regions 112, 114, and 116 near the electrode 102, 104, and 106, respectively, and/or in proximity to portions of the sensor region 120. The antiferromagnetic materials near the input/channel regions 112, 114, and 116 may have a different blocking temperature than the antiferromagnetic material(s) near the sensor region 120. This allows the magnetizations of these regions to be set in different directions at different temperatures. In another embodiment, the input/channel regions 112, 114, and 116 and/or the sensor region 102 may include multiple layers and/or multiple magnetic materials. The multiple layers may include ferromagnetic materials as well as nonmagnetic materials. The coercivity of the input/channel region 112, 114, and 116 and/or sensor region 120 may differ. As a result, the input/channel regions 112, 114, and 116 and sensor region 120 magnetic orientations may be set by applying magnetic fields. However, regardless of the mechanisms used to initialize the magnetization of these regions, domain wall motion is desired to be possible in the logic device.

The logic device 100 uses domain wall motion in order to perform logic operations. More specifically, a voltage on a particular input electrode 102, 104, and/or 106 may cause current to flow between input electrode 102, 104, and/or 106 and the ground electrode 140. As the current traverses the magnetic input/channel region 112, 114, and/or 116, the current may become spin polarized. Thus, in the device shown in FIG. 2, the current becomes spin polarized in the up direction by the input/channel regions 112, 114, and 116. Through the transfer of spin torque from the polarized current, more of the magnetic moments in the input/channel region 112, 114, and 116 along a channel from a particular input electrode 102, 104, and 106, respectively, become oriented in the up direction. Stated differently, the domain wall 113, 115, and 117 may move toward the sensor region 120. However, due to the configuration of the logic device 100, the domain wall 113, 115, and 117 may not move past the sensor 130 for certain input voltages. Instead, the domain wall may become pinned at or near the interface of the input/channel region 112, 114, and 116 and the sensor region 120. The energy of a domain wall is generally proportional to the cross-section of the area occupied by the domain wall. The sensor region 120 has a larger cross-sectional area than the input/channel region 112, 114, and/or 116. Consequently, a domain wall 113, 115, and 117 may require greater energy to move from an input/channel region 112, 114, or 116 to the sensor region 120. In the embodiment shown, as seen in the side view, the sensor region 120 is thicker than each of the input/channel regions 112, 114, and 116. In addition, as can be seen in the top view, the sensor region 120 may be wider than an individual input/channel region 112, 114, or 116. However, other geometries are possible. The net result is that the cross-sectional area of the sensor region 120 is larger than that of an individual input/channel region 112, 114, and 116. Note that mechanisms other than geometry may be used instead of or in addition to geometry to retard the motion of an individual domain wall 113, 115, and 117 from moving into the sensor region. Consequently, spin transfer torque due to the spin polarized current through a single input/channel region 112, 114, and 116 from a single input electrode 102, 104, and 106, respectively, may be insufficient to move the domain wall 113, 115, and 117, respectively from that input/channel region 112, 114, and 116, respectively, into the sensor region 120. A domain wall of greater energy may be required. Such a domain wall may be achieved by domain walls from multiple input/channel regions 112, 114, and 116. More specifically, some combination of domain wall motion due to current from input electrode 102, 106, and 104 having input voltages Vi1, Vi2, and Vs may possess sufficient energy to be capable of moving a domain wall 113, 117, and 115, respectively, into the sensor region 120. If the domain wall formed by some combination of walls 113, 115, and 117 moves past the sensor 130, the sensor 130 changes from a low resistance state to high resistance state. Based on the inputs, therefore, domain walls 113, 115, and 117 may either not move into the sensor region 120 or may move past the sensor 130. These two domain wall locations represent different states for the sensor 130. The logic device 100 may thus provide an output based on the input voltages.

Figure 3:
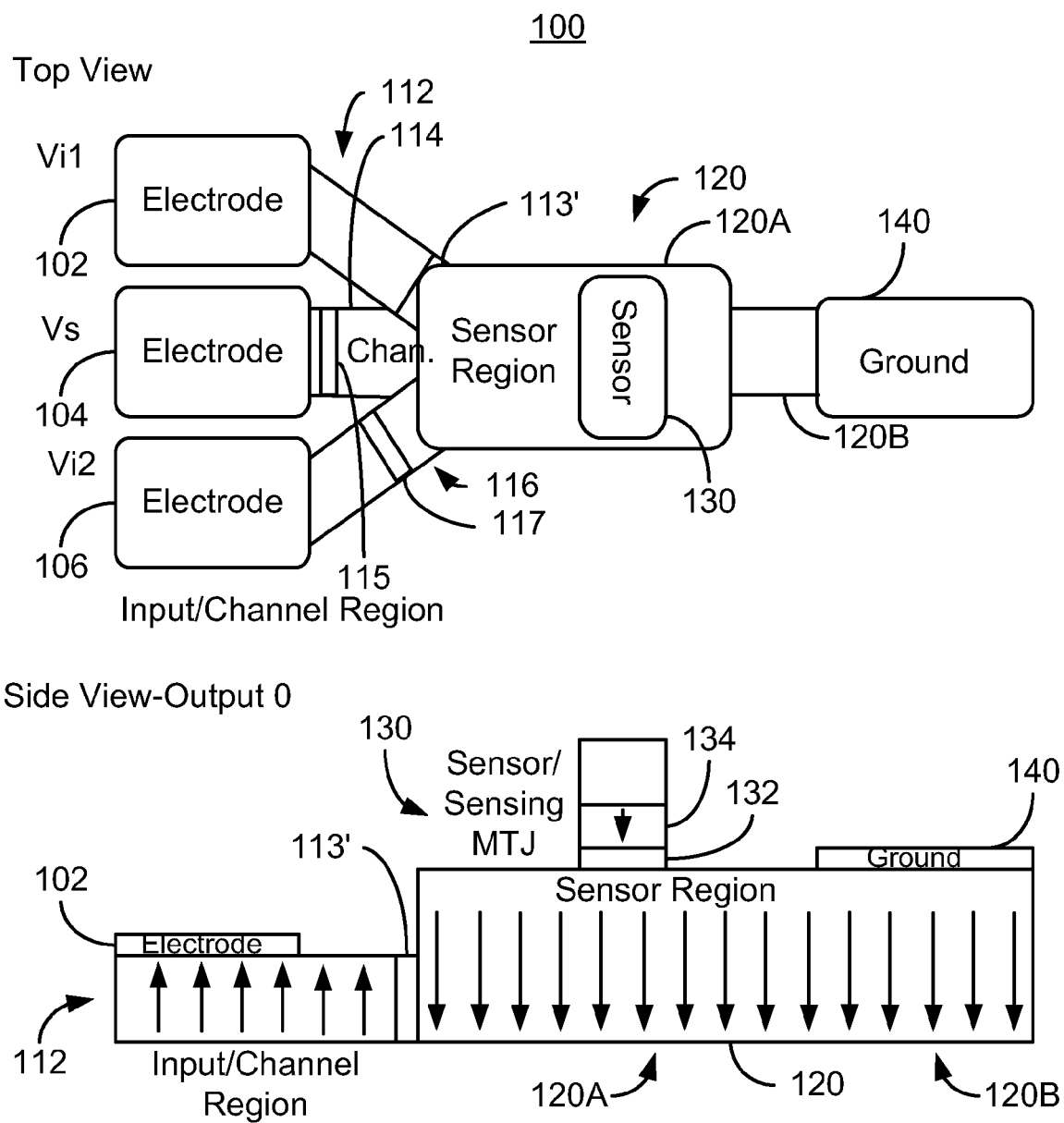
FIG. 3 depicts another exemplary embodiment of a magnetic logic device.

For example, FIG. 3 depicts the logic device 100 when a voltage, such as the supply voltage, has been applied to the Vi1 electrode 102 and the cross-sectional area of the sensor region 120 is greater than that of the input/channel region 112. Thus, the domain wall 113' for the input/channel region 112 has moved to the interface between the sensor region 120 and the input/channel region 112. However, insufficient voltage has been applied to the remaining electrode 104 and 106 for the corresponding domain walls 115 and 117, respectively to have moved to the interface between the input/channel region 114 and 116, respectively, and the sensor region 120. Thus, if a sense current is driven through the sensor 130, the sensor 130 still has a low resistance. Consequently, the output remains the same. The output may be determined by reading the resistance of or voltage across the sensor.

Figure 4:
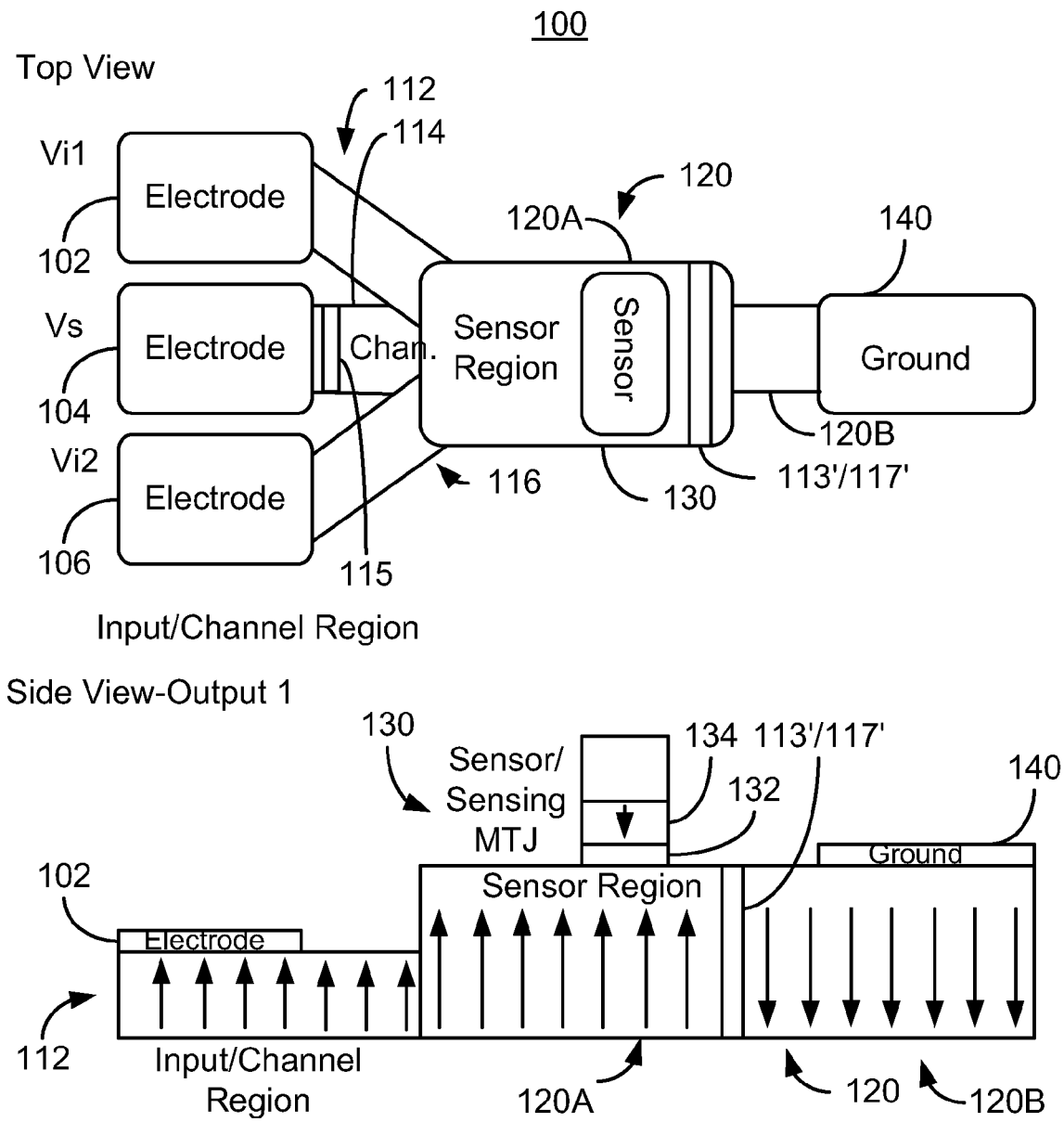
FIG. 4 depicts another exemplary embodiment of a magnetic logic device.

FIG. 4 depicts the logic device 100 when the cross-sectional area of the sensor region 120 is not more than approximately twice that of the input/channel region 112, 114, and 116 and a sufficient voltage has been applied to two of the input electrodes 102 and 106. Thus, a spin polarized current travels through two of the input/channel regions 112 and 116 from the electrodes 102 and 106. As a result, the domain walls 113' and 117 (forming domain wall 113'/117') may move into the sensor region 120 due to spin transfer torque from a spin polarized current. The two domain walls 113' and 115' have sufficient energy to cross into the sensor region 120 having the larger cross-sectional area. Thus, as is shown in FIG. 4, the domain wall 113'/117' may be driven past the sensor 130. The sensor 130 has a high resistance because its magnetization for layer 134 is antiparallel to the magnetization of the sensor region. Thus, based on the position of the domain wall 113'/117'—whether it has moved past the sensor 130—the output may change. The output may be determined by reading the resistance of or voltage across the sensor 130.

The logic devices depicted in FIGS. 2-4 are ones in which the electrode 104 has been biased low. As a result, the domain wall 115 for the input/channel region 114 corresponding to the electrode 104 is not driven toward the sensor region 120. Because the cross-sectional area of the sensor region 120 is larger than that of the input/channel region 112, 114, and 116, more than one of the electrodes 102, 104, and 106 are driven high to be capable of moving the domain wall 113, 115, and 117, respectively, into the sensor region 120. In one embodiment, the sensor region 120 cross-sectional area is approximately (or slightly less than) twice the cross-sectional area of each of the input/channel regions 112, 114, and 116. Thus, it is possible to move the domain wall 113, 115, and 117 into the sensor region 120. For the logic device depicted in FIGS. 2-4, the function of the logic device is that of an AND gate. Stated differently, both electrode 102 and 106 are driven high to change the output of the sensor 130. However, the function of the logic device 100 may be changed based upon the voltage provided to the electrode 14 and the relationship between the cross-sectional areas of the sensor region and each input region (or other mechanism for retarding domain wall motion).

Figure 5:
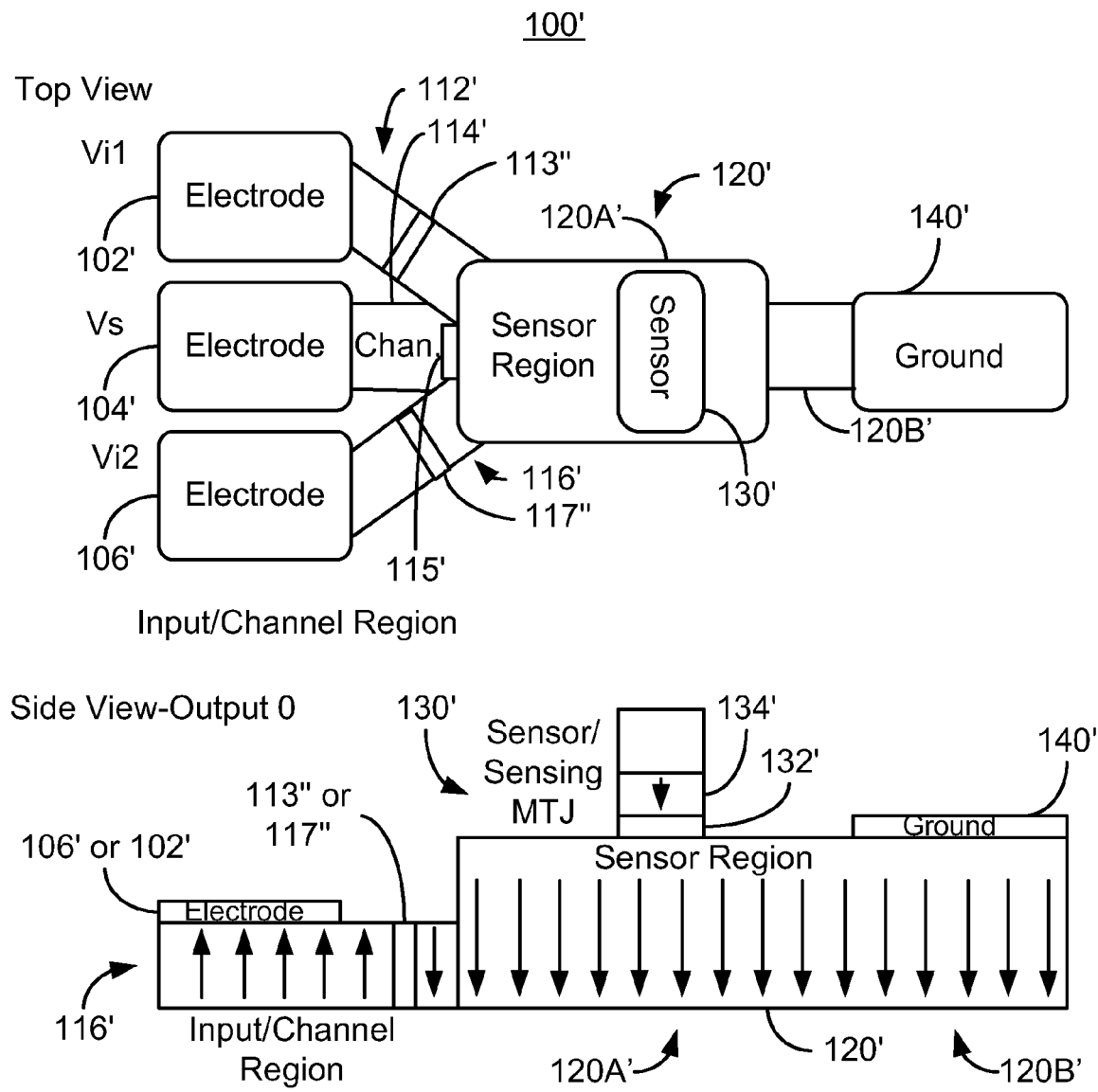
FIG. 5 depicts another exemplary embodiment of a magnetic logic device.

For example, FIG. 5 depicts the logic device 100' that is analogous to the logic device 100. Thus, the logic device 100' includes input/channel regions 112', 114', and 116', domain walls 113", 115' and 117", electrodes 102', 104', and 106', sensor region 120' having portions 120A' and 120B', sensor 130', and ground electrode 140' that correspond to input/channel regions 112, 114, and 116, domain walls 113/113', 115 and 117/117', electrodes 102, 104, and 106, sensor region 120 having portions 120A and 120B, sensor 130, and ground electrode 140, respectively. Thus, in the logic device 100', the cross-sectional area of the sensor region 120' is greater than the cross-sectional area of each input/channel region 112', 114', and 116' and not more than approximately twice the cross-sectional area of each input region 112', 114', and 116'. Stated differently, spin transfer from a spin polarized current traveling through two of the input/channel regions 112', 114', and 116' may move the domain wall 113', 115', and 117', respectively, from the input/channel regions 112', 114', 116', respectively, to the sensor region 120' and past the sensor 130'. In the embodiments shown, the electrode 104' is biased high (so that its domain wall 115' moves to the interface of the sensor region 120' and the input/channel region 114'). However, as shown in FIG. 5, the remaining electrodes 102' and 106' are in a quiescent state (not biased high), so that their domain walls 113" and 117" remain in the input/channel regions 112' and 116', respectively.

Figure 6:
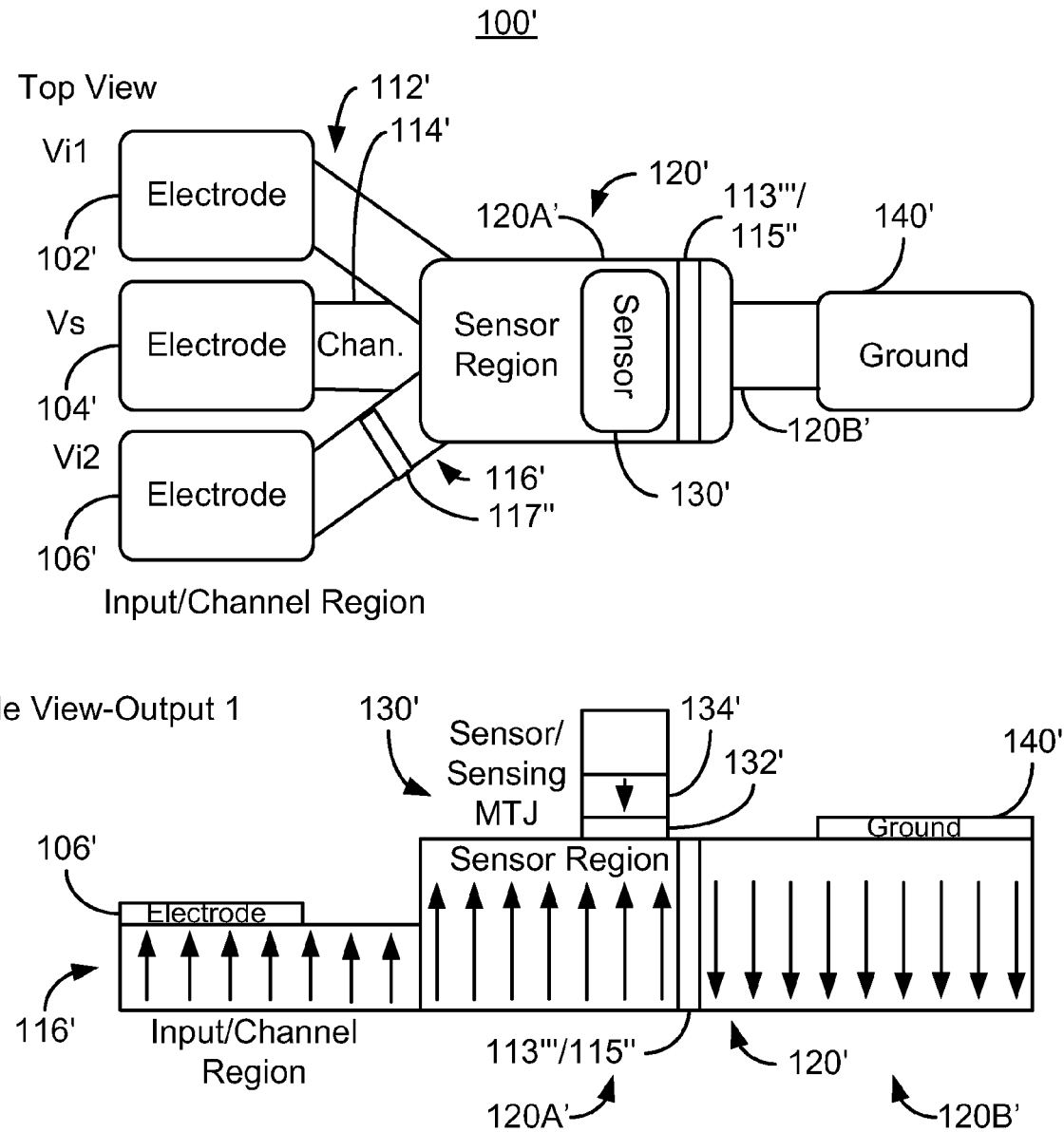
FIG. 6 depicts another exemplary embodiment of a magnetic logic device.

FIG. 6 depicts the logic device 100' after a high input has been provided to the electrode 102'. Note that the operation would be analogous for a high input to the electrode 106'. The high input to the electrode 102' moves the domain wall 113" along the input/channel region 112'. The energy of this domain wall 113" combines with that of the domain wall 115'. This allows the domain walls 113" and 115' into the sensor region 120'. Thus, domain wall 113'''/115" that has moved past the sensor 130' is shown. The motion of this domain wall 113"/115" results in a change in the state of the sensor 130'. Thus, the logic device 100' functions as an OR gate if the electrode 104' is biased high. Again, note that the electrode 102', 104', and 106' may be seen as interchangeable. If the electrode 104 is biased low as shown in FIGS. 2-4 (so that its domain wall 115 remains within the input/channel region 114), then only a high input to both electrodes 102 and 104 moves the domain wall 113'/117' along the input/channel regions 112 and 116, Only a high input to both electrodes 102 and 106 results in a change in the state of the sensor 130. Thus, the logic device 100 depicted in FIGS. 2-4 may function as an AND gate if the electrode 104 is biased low. If the electrode 104' is biased high as shown in FIGS. 5-6 (so that its domain wall 115' moves to the interface with the sensor region 120'), then a high input to only electrode 102', to only electrode 104', or to both 102' and 104' moves the domain wall 113" or 117" along the input/channel regions 112'. The combination of the domain wall 113" or 117" and the domain wall 115' can move into the sensor region. Thus, a high input to either or both of the electrode 102' and 106' results in a change in the state of the sensor 130'. Thus, the logic device 100' depicted in FIGS. 5-6 may function as an OR gate if the electrode 104 is biased high. Thus, the function of the logic device 100 may be altered based on the bias voltage applied to one of the electrodes 102/102', 104/104', and 106/106'.

The truth table for the logic device in such embodiments is shown in Table 1, below. The output, Vout, corresponds to the resistance sensed of the sensor. Consequently, based on the size of the cross-sectional area of the sensor region in comparison to the cross-sectional area of the input regions/channels and based on the bias provided to the Vs electrode, the logic device depicted in FIGS. 2-6 may be configured to provide various logic operations. A spin transfer torque-based device may thus be used as a logic device.

TABLE 1

| GATE TYPE | Vs | Vi1 | Vi2 | Vout |
|---|---|---|---|---|
| AND | 0 | 0 | 0 | 0 |
| AND | 0 | 1 | 0 | 0 |
| AND | 0 | 0 | 1 | 0 |
| AND | 0 | 1 | 1 | 1 |
| OR | 1 | 0 | 0 | 0 |
| OR | 1 | 1 | 0 | 1 |
| OR | 1 | 0 | 1 | 1 |
| OR | 1 | 1 | 1 | 1 |

Once the logic device 100/100' depicted in FIGS. 2-6 has been programmed, it may be reset. For example, a current driven in the opposite direction to the current used to program the device may reset the logic device 100/100'. A current driven in the opposite direction may become spin polarized by the portion of the sensor region 120'120' on the right side of the domain wall 113'/117' or 113'''/115" in FIGS. 4 and 6. Thus, the domain wall may be moved. Because the cross-sectional area of the sensor region 120/120' is larger than the input/channel regions 112/112', 114/114', 116/116', the domain wall is not stopped when moving from the sensor region 120/120' to the input/channel regions 112/112', 114/114', and 116/116'. Thus, the domain wall may move back into the input/channel region 112/112', 114/114', and 116/116' and the logic device 100/100' reinitialized. Alternatively, in some embodiments, if antiferromagnetic material(s) are used to bias the input regions/channels 112/112', 114/114', and 116/116' and sensor region 120/120', removal of the input voltages, and thus removal of the impetus for the domain wall to move to the sensor region 120/120', may result in the magnetizations of the input/channel regions 112/112', 114/114', and 116/116' and sensor regions 120/120' returning to their original states. Thus, reinitialization using a current or external magnetic field may be unnecessary.

In some embodiments, the widths of the channels may be approximately one hundred nanometers or larger. Thus, the logic device 100/100' may be made small. Further, movement of the domain wall may be relatively quick. In some embodiments, the time for the domain wall 113'/117' or 113'''/115" to move to a position past the sensor may be on the order of one hundred nanoseconds or less. In some embodiments, the time required to move the domain wall may be less than ten nanoseconds. In some such embodiments, the time required to move the domain wall 113'/117' or 113'''/115" may be less than or equal to five nanoseconds. Further, for some embodiments, the energy required for a logic operation (the energy expended by the current driven through the logic device 100/110') may be not more than $1 \times 10^{-17}$ joules (10 aJoules). In some embodiments, the energy required may be not more than 6.25 aJoules per operation. Further, the output of the logic device 100/100' may be determined based on the resistance of the sensor 130/130'. For example, a known current may be provided through the sensor 130/130' (e.g. a known voltage applied to the sensor 130/130') and the voltage across the sensor 130/130' read. The current through the sensor 130/130' may be significantly less than the current required to move the domain wall. For example, the current through a channel may be given by $Ii=Vi/R_{input\ region}$. The resistance of the input/channel region 112/112', 114/114', and 116/116' may be small as the magnetic input/channel region 112/112', 114/114', and 116/116' may be metal. The current used in moving the domain wall is, therefore, large. In contrast, the current through the sensor is $I_{Read}=V_{Read}/R_{MTJ}$. The resistance of the sensor 130/130' is generally relatively high and the VRead may be set relatively low. Thus, the current through the logic device 100/100' during reading may be insufficient to move the domain wall. As a result, reading output may not influence the input. Thus, inadvertent feedback may be eliminated. The logic device 100/100' may have the desired gain, for example by setting the resistance of the sensor 130/130' and/or the current through the sensor 130/130'. The logic device 100/100' may also be non-linear. Stated differently, either a high resistance or a low resistance state may be achieved for the domain wall to one or the other side of the sensor 130/130'. As discussed below, the logic device 100/100' may be concatenated with other logic device(s) and the output of the logic device 100/100' used as the input of another logic device. Further, a complete set of Boolean operators may be built upon the AND and OR devices. Consequently, a set of spin-transfer torque based logic device may be provided.

Figure 7:
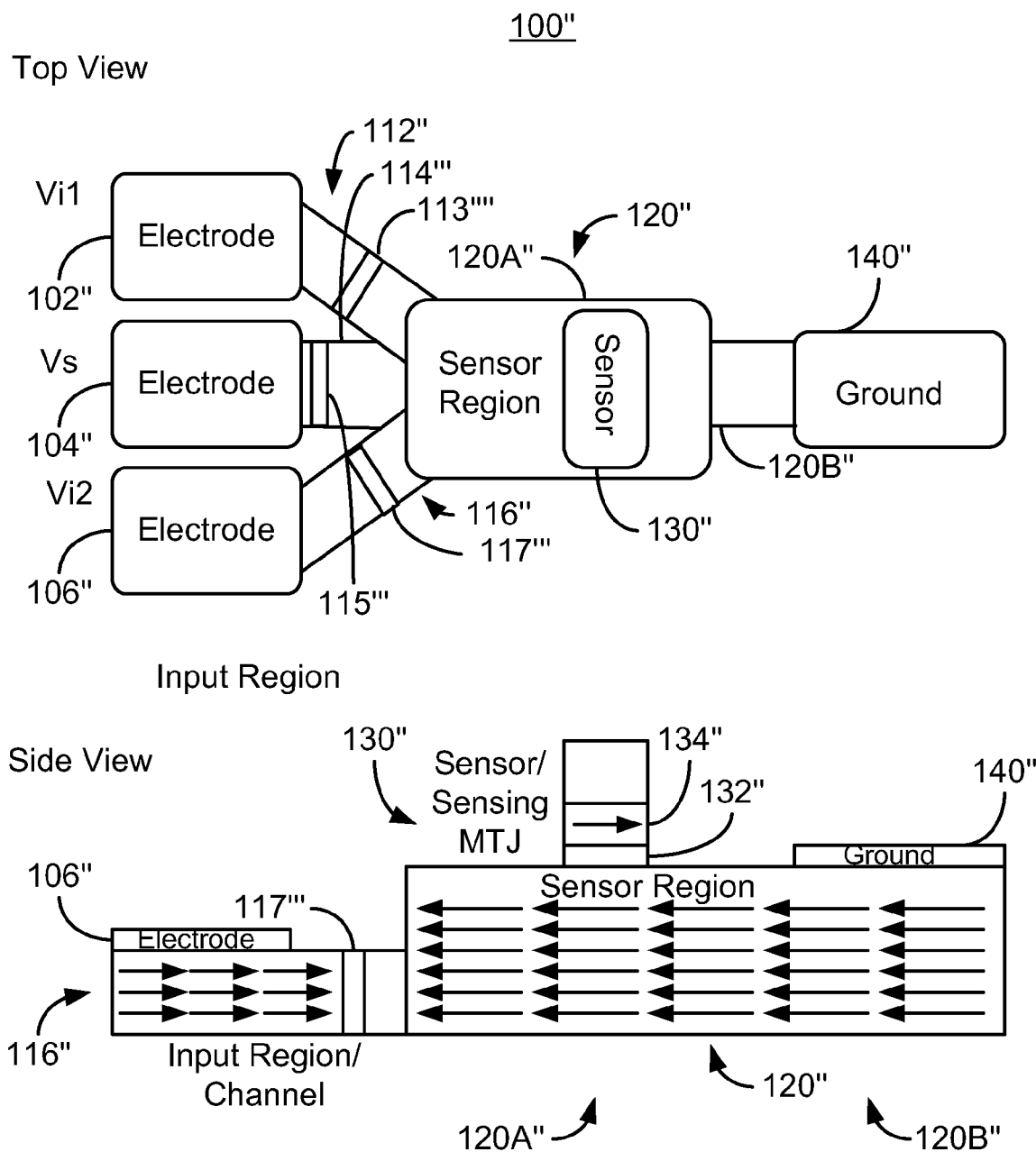
FIG. 7 depicts another exemplary embodiment of a magnetic logic device.

FIG. 7 depicts another exemplary embodiment of a logic device 100". The logic device 100" is analogous to the logic devices 100 and 100'. Thus, the logic device 100" includes input/channel regions 112", 114", and 116", domain walls 113''', 115" and 117''', electrodes 102", 104", and 106", sensor region 120" having portions 120A" and 120B", sensor 130" having layers 132" and 134", and ground electrode 140" that correspond to input/channel regions 112/112', 114/114', and 116/116', domain walls 113/113'/113"/113''', 115/115'/115" and 117/117'/117", electrodes 102/102', 104/104', and 106/106', sensor region 120/120' having portions 120A/120A' and 120B/120B', sensor 130/130' having layers 132/132' and 134/134', and ground electrode 140/140', respectively. Thus, in the logic device 100", the cross-sectional area of the sensor region 120" is greater than the cross-sectional area of each input/channel region 112", 114", and 116" and not more than approximately twice the cross-sectional area of each input region 112", 114", and 116". Stated differently, spin transfer from a spin polarized current traveling through two of the input/channel regions 112", 114", and 116" may move the domain wall 113", 115", and 117", respectively, from the input/channel regions 112", 114", 116", respectively, to the sensor region 120" and past the sensor 130". In the embodiments shown, the electrode 104" is biased high (so that its domain wall 115" moves to the interface of the sensor region 120" and the input/channel region 114"). However, as shown in FIG. 7, the remaining electrodes 102" and 106" are in a quiescent state (not biased high), so that their domain walls 113''' and 117''' remain in the input/channel regions 112" and 116", respectively.

In the logic device 100", the input/channel regions 112", 114", and 116", sensor region 120" and sensor 130" are magnetically biased in-plane. However, the function of the logic device 100" is analogous to that of the logic device 100/100'. Thus, based on the bias voltage applied to the electrode 104", the logic device 100" may have different functions, including AND and OR logic functions. Thus, the logic device 100" may share the benefits of the logic devices 100/100'.

Figure 8:
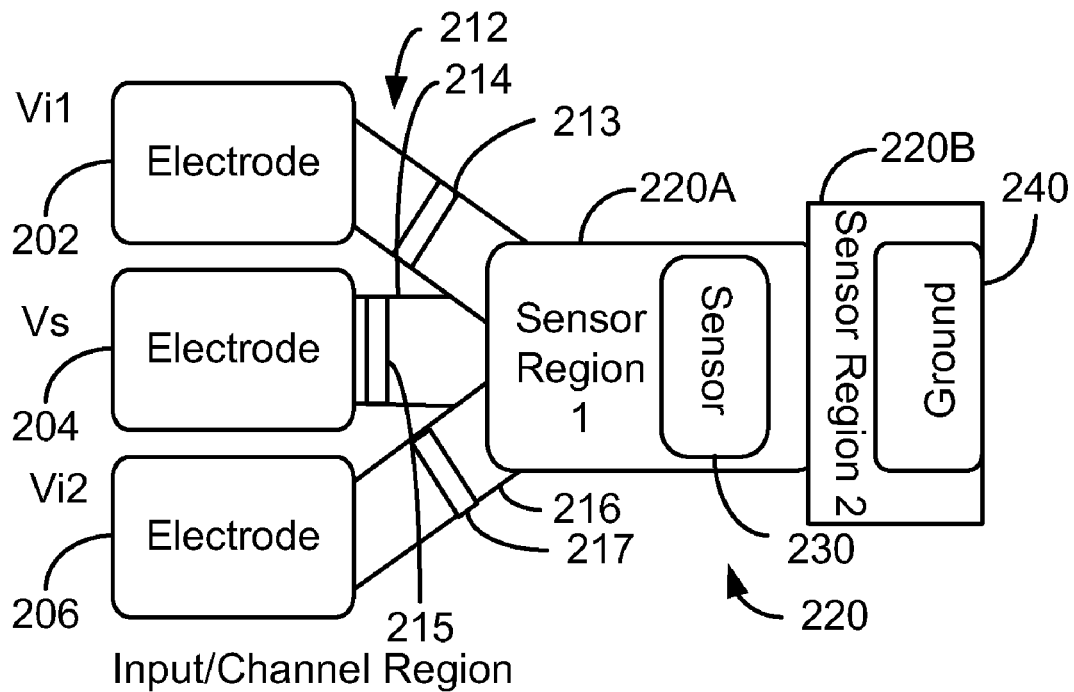
FIG. 8 depicts another exemplary embodiment of a magnetic logic device.
Figure 8:
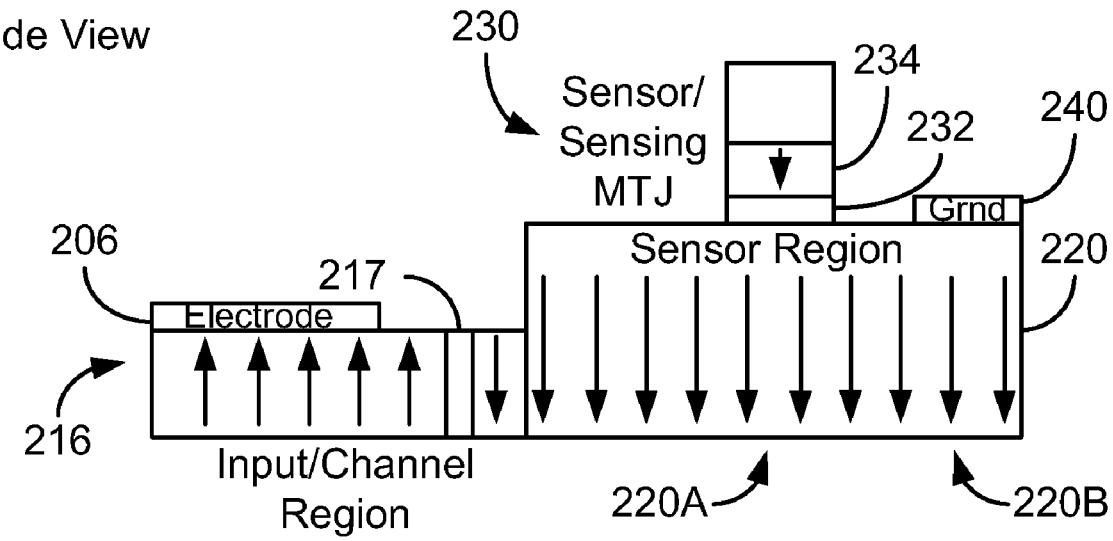

FIG. 8 depicts another embodiment of a logic device 200 based on spin transfer torque. The logic device 200 is analogous to the logic devices 100 and 100'. Thus, the logic device 200 includes input/channel regions 212, 214, and 216, domain walls 213, 215 and 217, electrodes 202, 204, and 206, sensor region 220 having portions 220A and 220B, sensor 230 having layers 232 and 234, and ground electrode 240 that correspond to input/channel regions 112/112', 114/114', and 116/116', domain walls 113/113'/113"/113''', 115/115'/115" and 117/117'/117", electrodes 102/102', 104/104', and 106/106', sensor region 120/120' having portions 120A/120A' and 120B/120B', sensor 130/130' having layers 132/132' and 134/134', and ground electrode 140/140', respectively. Thus, the structure and function of the components 202, 204, 206, 212, 213, 214, 215, 216, 217, 220, 220A, 220B, 230, and 240 are analogous to the structure and function of the components 102/102', 104/104', and 106/106', 112/112', 113/113'/113"/113''', 114/114', 115/115'/115", 116/116', 117/117'/117", 120/120', 120A/120A', 120B/120B', 130/130', and 140/140', respectively. However, as can be seen in the top view, the sensor region 220 of the logic device 200 includes two regions oriented in a different manner—sensor region-1 220A and sensor region-2 220B. The sensor region-2 220B has substantially the same thickness as but a larger width than the sensor region-1 220A. As a result, the sensor region-2 220B has a different, larger cross-sectional area than the sensor region-1 220A. The difference in the cross-sectional area may be set such that a domain wall that moves into the sensor region 220, and through the sensor region-1 220A, may not have sufficient energy to penetrate the sensor region-2 220B. Thus, the domain wall does not enter the region under the ground electrode 240. Further, although shown as having three input/channel regions 202, 204, and 206, the logic device depicted in FIG. 8 may have another number of input/channel regions and/or may provide different logic operations than the logic devices depicted in FIGS. 2-7. The logic device 200 depicted in FIG. 8 may have the benefits of one or more of the logic devices 100, 100', and 100" depicted in FIGS. 2-7. In addition, the domain wall may be prevented from moving under the ground electrode.

Figure 9:
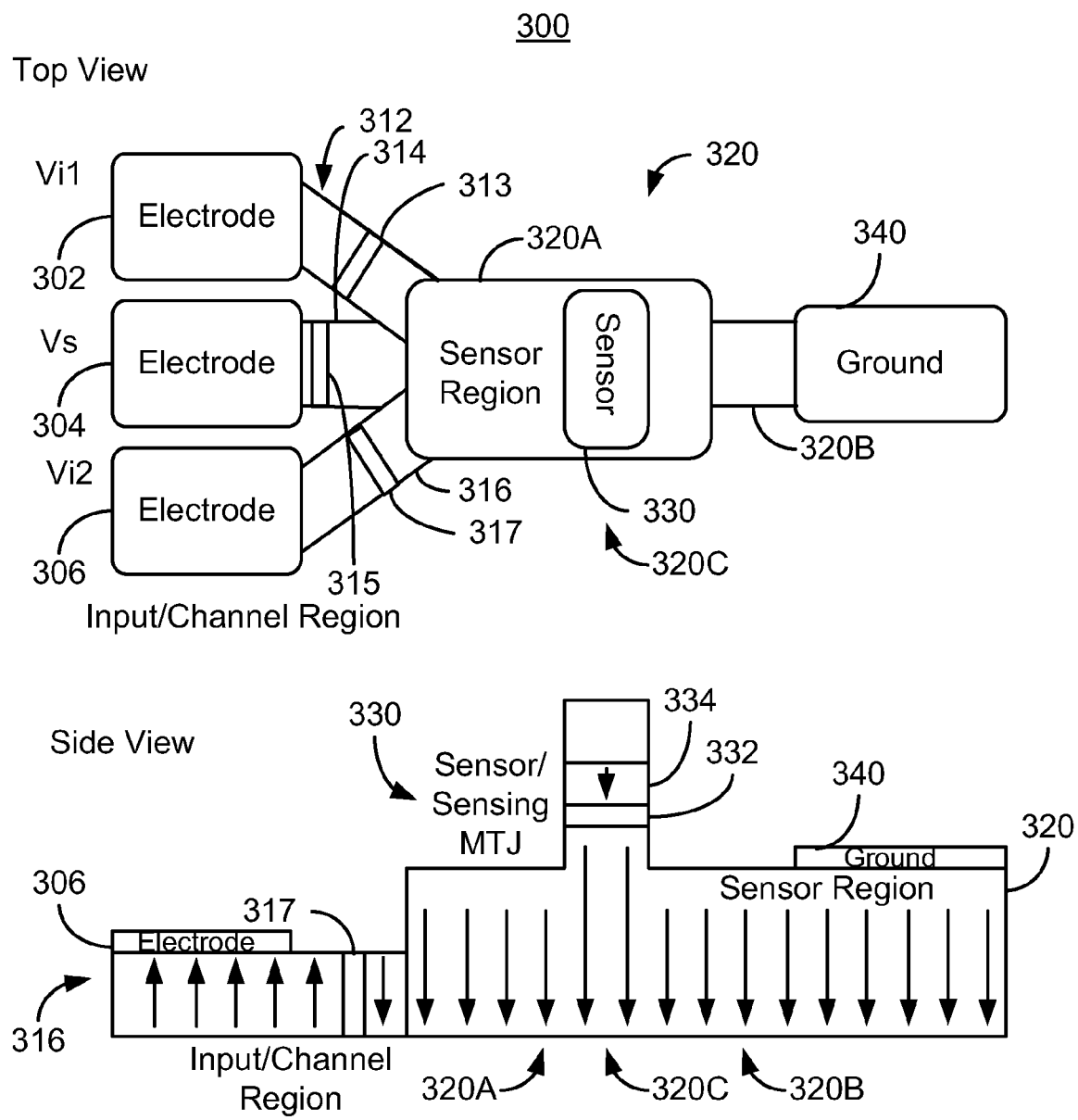
FIG. 9 depicts another exemplary embodiment of a magnetic logic device.

FIG. 9 depicts another embodiment of a logic device 300 based on spin transfer torque. The logic device 300 is analogous to the logic devices 100 and 100'. Thus, the logic device 300 includes input/channel regions 312, 314, and 316, domain walls 313, 315 and 317, electrodes 302, 304, and 306, sensor region 320 having portions 320A and 320B, sensor 330 having layers 332 and 334, and ground electrode 340 that correspond to input/channel regions 112/112', 114/114', and 116/116', domain walls 113/113'/113"/113''', 115/115'/115" and 117/117'/117", electrodes 102/102', 104/104', and 106/106', sensor region 120/120' having portions 120A/120A' and 120B/120B', sensor 130/130' having layers 132/132' and 134/134', and ground electrode 140/140', respectively. Thus, the structure and function of the components 302, 304, 306, 312, 313, 314, 315, 316, 317, 320, 320A, 320B, 330, and 340 are analogous to the structure and function of the components 102/102', 104/104', and 106/106', 112/112', 113/113'/113"/113''', 114/114', 115/115'/115", 116/116', 117/117'/117", 120/120', 120A/120A', 120B/120B', 130/130', and 140/140', respectively. Although shown as having three electrodes 302, 304, and 306, the logic device 300 may have another number of input/channel regions and/or may provide different logic operations than the logic devices depicted in FIGS. 2-7. However, as can be seen the thickness of the sensor region 320 is greater in the region of the sensor 130. Thus, sensor region 320C is has an increased thickness. The logic device 300 depicted in FIG. 5 may have the benefits one or more of the logic devices 100, 100', 100", and 200 and may be combined with the logic devices 100, 100', 100", and/or 200.

Figure 10:
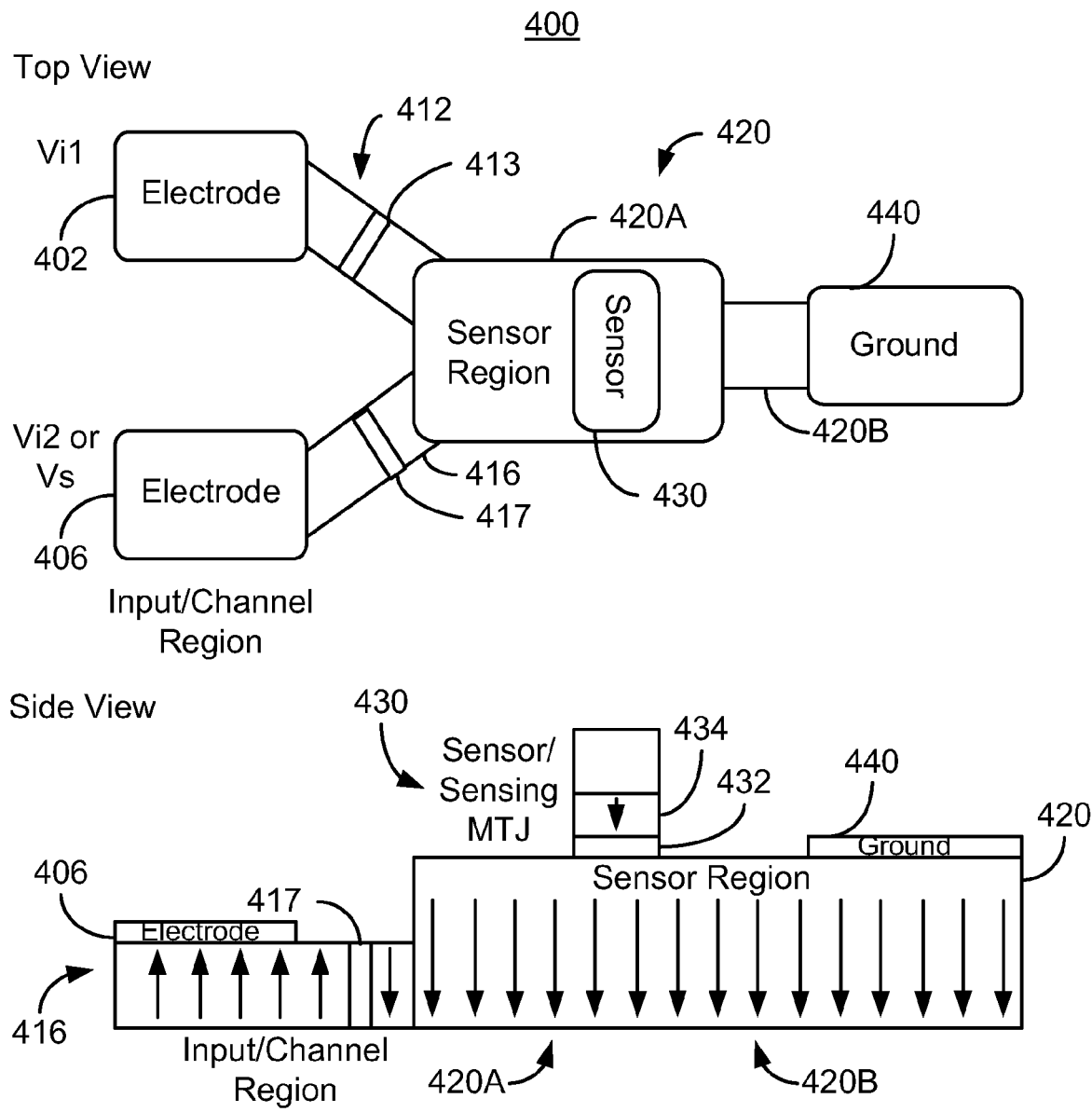
FIG. 10 depicts another exemplary embodiment of a magnetic logic device.

FIG. 10 depicts another embodiment of a logic device 400 based on spin transfer torque. The logic device 400 is analogous to the logic devices 100 and 100'. Thus, the logic device 400 includes input/channel regions 412, $_{[DMa1]}$ and 416, domain walls 413 and 417, electrodes 402, and 406, sensor region 420 having portions 420A and 420B, sensor 430 having layers 432 and 434, and ground electrode 440 that correspond to input/channel regions 112/112' and 116/116', domain walls 113/113'/113"/113''' and 117/117'/117", electrodes 102/102' and 106/106', sensor region 120/120' having portions 120A/120A' and 120B/120B', sensor 130/130' having layers 132/132' and 134/134', and ground electrode 140/140', respectively. Thus, the structure and function of the components 402, 406, 412, 413, 416, 417, 420, 420A, 420B, 430, and 440 are analogous to the structure and function of the components 102/102' and 106/106', 112/112', 113/113'/113"/113''', 116/116', 117/117'/117", 120/120', 120A/120A', 120B/120B', 130/130', and 140/140', respectively. However, the logic device 400 shown has another number of input/channel regions and thus another number of electrodes. In particular, the logic device 400 includes only two input/channel regions 412 and 416 and only two corresponding electrodes 402 and 406. In some embodiments, in which the sensor region 420 has a cross-sectional area greater than each input/channel region 412 and 416 and not more than the sum of the cross-sectional areas of the input/channel regions 412 and 416, the logic device 400 may function as an AND device. The logic device 400 may have the benefits of one or more of the logic devices 100, 100', 100", 200, and 300 and may be combined with one or more of the logic devices 100, 100', 100", 200, and 300. In other embodiments, another number of input/channel regions may be used and/or other logic operations performed.

Figure 11:
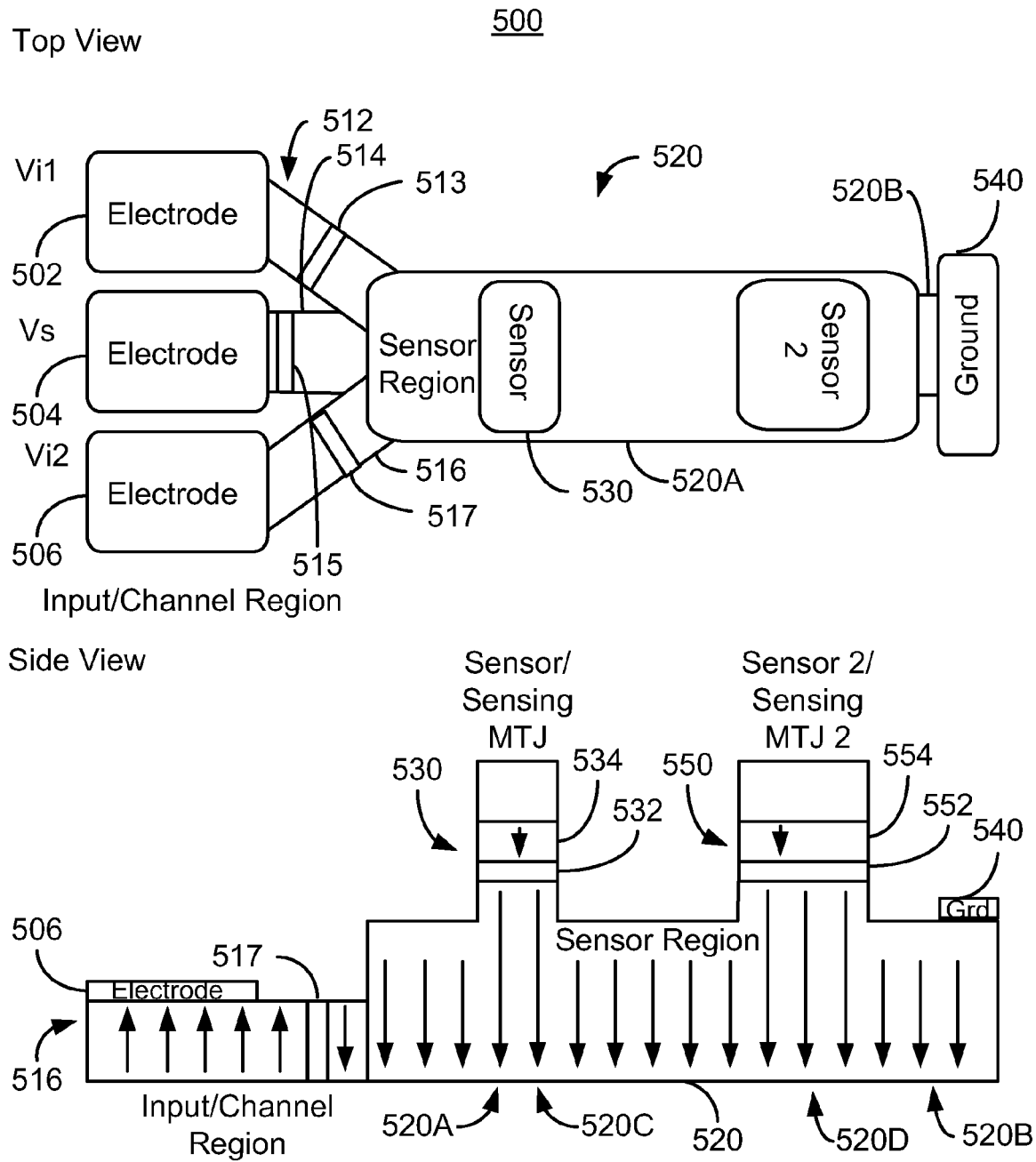
FIG. 11 depicts another exemplary embodiment of a magnetic logic device.

FIG. 11 depicts another embodiment of a logic device 500 based on spin transfer torque. The logic device 500 is analogous to the logic devices 100 and 100'. Thus, the logic device 500 includes input/channel regions 512, 514, and 516, domain walls 513, 515 and 517, electrodes 502, 504, and 506, sensor region 520 having portions 520A and 520B, sensor 530 having layers 532 and 534, and ground electrode 540 that correspond to input/channel regions 112/112', 114/114', and 116/116', domain walls 113/113'/113"/113''', 115/115'/115" and 117/117'/117", electrodes 102/102', 104/104', and 106/106', sensor region 120/120' having portions 120A/120A' and 120B/120B', sensor 130/130' having layers 132/132' and 134/134', and ground electrode 140/140', respectively. Thus, the structure and function of the components 502, 504, 506, 512, 513, 514, 515, 516, 517, 520, 520A, 520B, 530, and 540 are analogous to the structure and function of the components 102/102', 104/104', and 106/106', 112/112', 113/113'/113"/113''', 114/114', 115/115'/115", 116/116', 117/117'/117", 120/120', 120A/120A', 120B/120B', 130/130', and 140/140', respectively. Although shown as having three input/channel regions 512, 514, and 516, the logic device 500 may have another number of input/channel regions and/or may provide different logic operations than the logic devices 100, 100', 100", 200, 300, and 400.

The logic device 500 includes a second sensor. As can be seen the thickness of the sensor region 520 is greater in the regions of the sensors 530 and 550. Thus, as shown, regions 520C and 520D are shown. However, in other embodiments, the thickness of the sensor region 520 may not vary under the sensors. The logic device 500 is configured to be programmed using domain wall motion. In addition, the configuration of the logic device 500 may be such that a domain wall may be trapped between the sensor 530 and sensor 550. The resistance of the sensor 550 may not change even when the resistance of the sensor 530 does change. Such a configuration may, therefore, allow for self referencing of the sensor 530 using sensor 550. Other functions are also possible, including allowing the domain wall to move past sensor 550. The logic device 550 may have the benefits of one or more of the logic devices 100, 100', 100", 200, 300, and 400 and may be combined with one or more of the logic devices 100, 100', 100", 200, 300, and 400. In addition, the logic device 500 may allow for a self-referencing read scheme.

Figure 12:
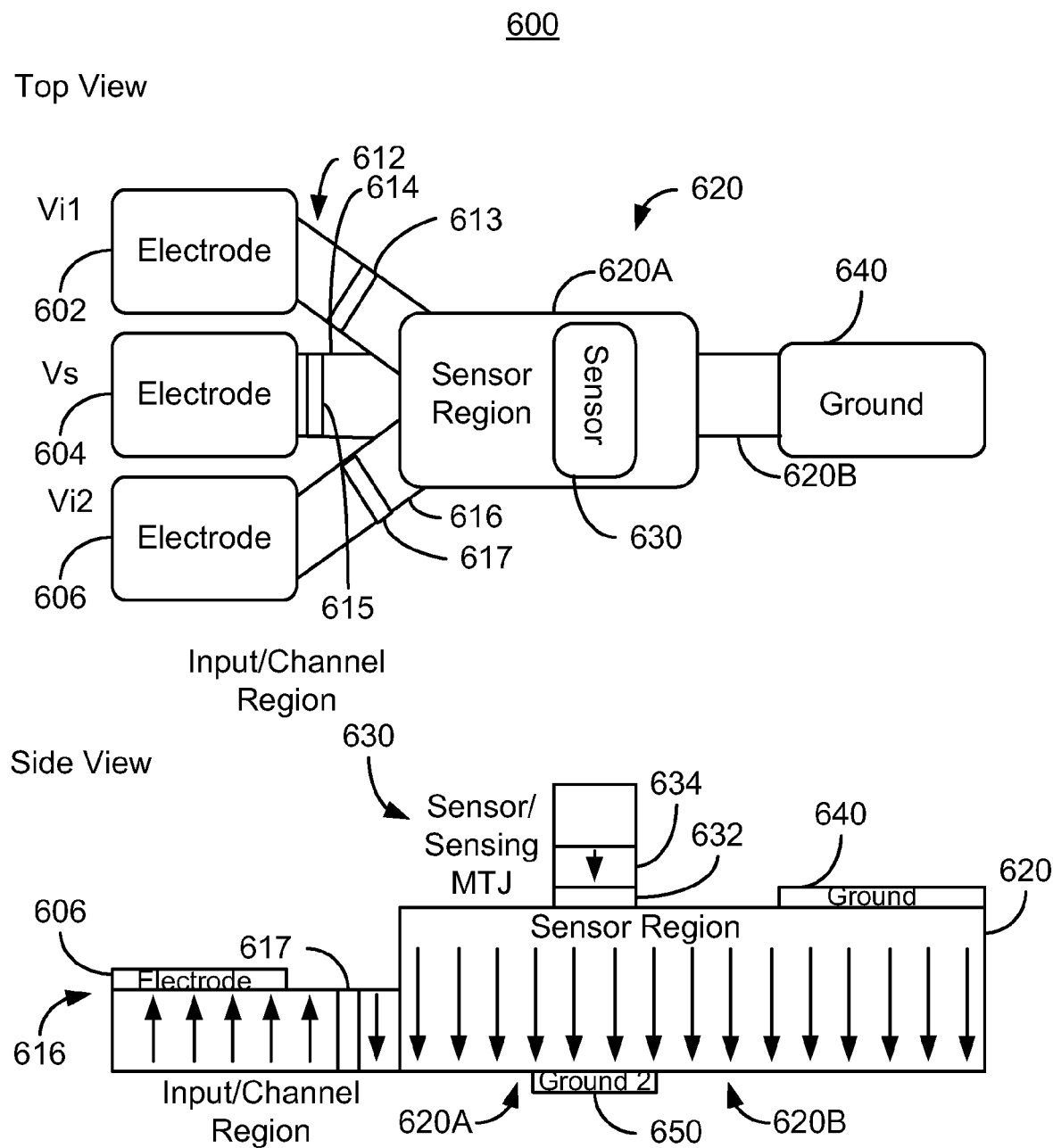
FIG. 12 depicts another exemplary embodiment of a magnetic logic device.

FIG. 12 depicts another embodiment of a logic device 600 based on spin transfer torque. The logic device 600 is analogous to the logic devices 100 and 100'. Thus, the logic device 600 includes input/channel regions 612, 614, and 616, domain walls 613, 615 and 617, electrodes 602, 604, and 606, sensor region 620 having portions 620A and 620B, sensor 630 having layers 632 and 634, and ground electrode 640 that correspond to input/channel regions 112/112', 114/114', and 116/116', domain walls 113/113'/113"/113''', 115/115'/115" and 117/117'/117", electrodes 102/102', 104/104', and 106/106', sensor region 120/120' having portions 120A/120A' and 120B/120B', sensor 130/130' having layers 132/132' and 134/134', and ground electrode 140/140', respectively. Thus, the structure and function of the components 602, 604, 606, 612, 613, 614, 615, 616, 617, 620, 620A, 620B, 630, and 640 are analogous to the structure and function of the components 102/102', 104/104', and 106/106', 112/112', 113/113'/113"/113''', 114/114', 115/115'/115", 116/116', 117/117'/117", 120/120', 120A/120A', 120B/120B', 130/130', and 140/140', respectively. Although shown as having three input/channel regions 612, 614, and 616, the logic device 600 may have another number of input/channel regions and/or may provide different logic operations than the logic devices 100, 100', 100", 200, 300, 400, and 500. In addition, the logic device includes a second ground 650. The ground 650 may be used in reading the sensor 630. In particular, a read current driven through the sensor 630 may travel to the ground 650 instead of the ground 640. There may less spin polarized current traveling toward the ground 640 in the logic device 600. As a result, there may be a lower possibility of inadvertently moving the domain wall in the logic device 600 during a read operation. The logic device 600 may have the benefits of one or more of the logic devices 100, 100', 100", 200, 300, 400, and 500 and may be combined with one or more of the logic devices 100, 100', 100", 200, 300, 400, and 500. Further, the location of the ground 650 may be selected to reduce the possibility of an inadvertently programming the logic device 600.

Figure 13:
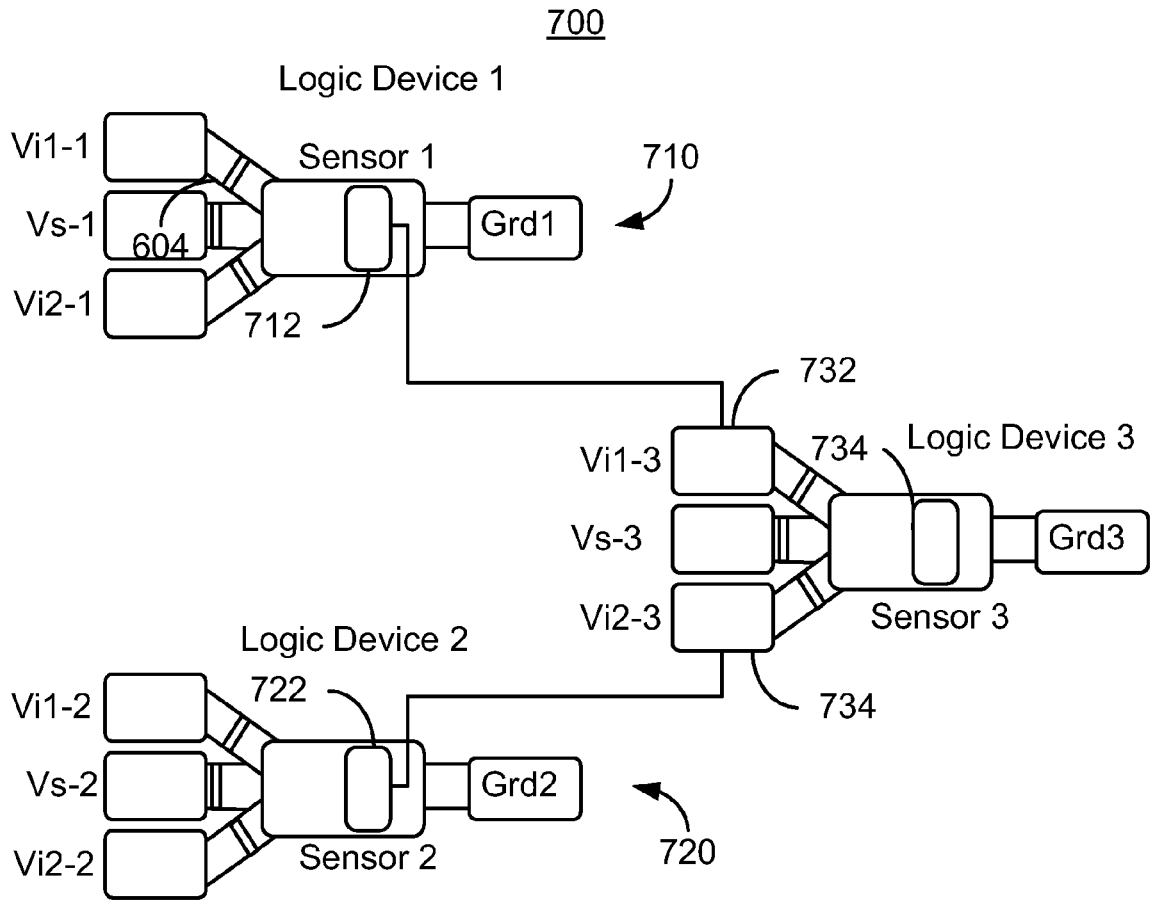
FIG. 13 depicts another exemplary embodiment of magnetic logic devices configured to provide a logical function.

FIG. 13 is an exemplary embodiment of a logic component 700 in which the logic devices 710, 720, and 730 $_{[DMA2]}$ might be concatenated. The logic devices 710, 720, and 730 may correspond to one or more of the logic devices 100, 100', 100", 200, 300, 400, 500, and 600. As can be seen in FIG. 9, the outputs (sensor 712 and sensor 722) of the logic devices 710 and 720 may be provided to the input electrodes 732 and 734 of logic device 730. Although not shown, additional circuitry may be provided between the outputs of logic devices 710 and 720 and the inputs 732 and 734 of logic device 730. For example, amplifiers and/or other circuitry might be included between sensors 712 and 722 and the inputs 732 and 734, respectively. However, as can be seen in FIG. 13, the outputs 712 and 722 of logic devices 710 and 720, respectively, may be used to drive the inputs 732 and 734, respectively of logic device 730. The output 734 of logic device 730 may likewise be used to drive the inputs of other logic device(s) (not shown). Consequently, logic devices 100, 100', 100", 200, 300, 400, 500, 600, 710, 720, and 730 based on spin transfer torque may be concatenatable.

Figure 14:
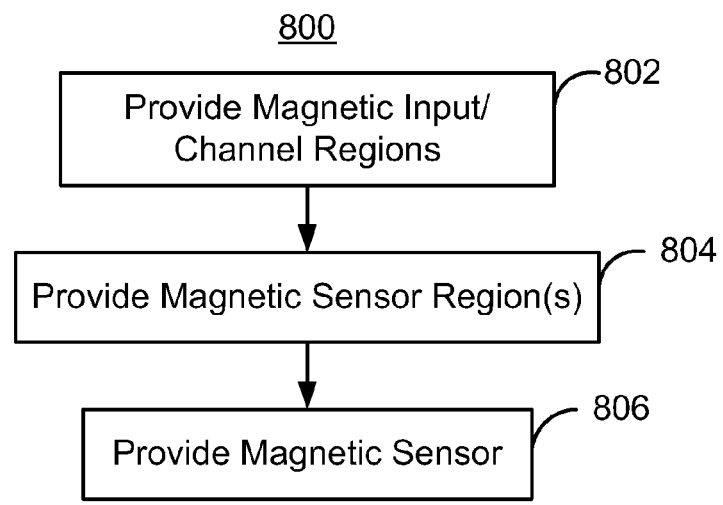
FIG. 14 depicts an exemplary embodiment of a method for providing a logic device.

FIG. 14 depicts an exemplary embodiment of a method 800 for providing a logic device, such as the logic devices 100, 100', 200, 300, 400, 500, 600, 710, 720, and/or 730. For simplicity, some steps may be omitted, combined, interleaved, and/or performed in another sequence. The method 800 is described in the context of the logic device 100. However, the method 800 may be used to fabricate other logic devices, such as the logic devices 100', 100", 200, 300, 400, 500, 600, 710, 720, and/or 730. In addition, the method 800 is described in the context of fabricating a logic device 100. However, multiple logic devices may be fabricated substantially in parallel. Further, although described as separate steps, portions of the method 800 may be interleaved. Finally, the steps of the method 800 typically include multiple substeps.

The magnetic input/channel regions 112, 114, and 116 are provided, via step 802. Step 802 may include magnetically biasing the input/channel regions 112, 114, and 116 as well as providing electrodes 102, 104, and 106, respectively. The magnetic sensor region 120 is provided, via step 804. Step 804 may include biasing the sensor region 120, patterning the sensor region 120, and otherwise forming the desired cross-sectional area of the sensor region 120. The magnetic sensor 130 corresponding to the magnetic sensor region 130 is provided, via step 806. In embodiments in which more than one sensor per device is provided, step 806 may form multiple sensors. Further, ground and other electrodes may also be provided. Thus, the logic device 100 may be fabricated and the attendant benefits realized.

A method and system for providing magnetic logic devices using spin transfer torque based have been described. The method and system have been described in accordance with the exemplary embodiments shown, and one of ordinary skill in the art will readily recognize that there could be variations to the embodiments, and any variations would be within the spirit and scope of the method and system. For example, various combinations including features of one or more of the logic devices shown in FIGS. 2-13 may be used. Accordingly, many modifications may be made by one of ordinary skill in the art without departing from the spirit and scope of the appended claims.

We claim:

1. A logic device comprising:
    a plurality of magnetic input/channel regions, each of the plurality of magnetic input/channel regions being magnetically biased in a first direction;
    at least one magnetic sensor region being magnetically biased in a second direction different from the first direction such that at least one domain wall resides in the plurality of magnetic input/channel regions if the logic device is in a quiescent state; and
    at least one sensor coupled with the at least one magnetic sensor region, the at least one sensor for outputting a signal based on a magnetic state of the at least one magnetic sensor region;
    wherein the plurality of input/channel regions and the at least one magnetic sensor region are configured such that the at least one domain wall may move into the at least one magnetic sensor region in response to a logic signal being provided to at least a portion of the plurality of magnetic input regions.

2. The logic device of claim 1 wherein each of the plurality of magnetic input/channel regions has a corresponding input cross-sectional area and the at least one magnetic sensor region has a corresponding sensor cross-sectional area greater than the input cross-sectional area.

3. The logic device of claim 2 wherein the plurality of magnetic input/channel regions consists of three magnetic input channel regions and wherein the sensor cross-sectional area is twice the input cross-sectional area.

4. The logic device of claim 3 wherein one of the three magnetic input channel regions is coupled with a supply voltage.

5. The logic device of claim 2 wherein the each of the plurality of magnetic input/channel regions has a first thickness and wherein the at least one sensor region has a second thickness greater than the first thickness.

6. The logic device of claim 2 wherein the plurality of magnetic input/channel regions consists of two magnetic input channel regions and wherein the sensor cross-sectional area is twice the input cross-sectional area.

7. The logic device of claim 1 wherein the first direction is substantially perpendicular to a plane of the plurality of magnetic input regions and wherein the second direction is antiparallel to the first direction.

8. The logic device of claim 1 further comprising:
    a plurality of input electrodes corresponding to the plurality input/channel regions.

9. The logic device of claim 8 further comprising:
    a ground electrode, the at least one sensor residing between the plurality of input/channel regions and the ground.

10. The logic device of claim 9 further comprising:
    an additional ground electrode, the at least one sensor region residing between the additional ground electrode and the at least one sensor.

11. The logic device of claim 1 the each of the at least one sensor further includes:
    a nonmagnetic spacer layer; and
    a pinned layer, the nonmagnetic spacer layer residing between the pinned layer and the at least one sensor region.

12. The logic device of claim 11 wherein the nonmagnetic spacer layer is a tunneling barrier layer.

13. The logic device of claim 1 wherein
    wherein the plurality of input/channel regions and the at least one magnetic sensor region are configured such that the at least one domain wall may move due to spin transfer torque.

14. A logic device comprising:
    a plurality of input electrode;
    a plurality of magnetic input/channel regions corresponding to the plurality of input electrodes, each of the plurality of magnetic input/channel regions being magnetically biased in a first direction and having a cross-sectional area, one of the plurality of magnetic input/channels regions being coupled with a bias voltage;
    at least one magnetic sensor region having a sensor region cross-sectional area greater than the cross-sectional area, being magnetically biased in a second direction different from the first direction such that at least one domain wall resides in the plurality of magnetic input/channel regions if the logic device is in a quiescent state; and
    at least one sensor coupled with the at least one magnetic sensor region, each of the at least one sensor including a free layer and a nonmagnetic spacer layer residing between the at least one magnetic sensor region and the free layer, the at least one magnetic sensor region being a free layer for the at least one sensor;
    wherein the plurality of input/channel regions and the at least one magnetic sensor region are configured such that the at least one domain wall may move into the at least one magnetic sensor region in response to spin transfer torque due to a logic signal being provided to at least a portion of the plurality of magnetic input regions.

15. A method for providing a logic device comprising:
    providing a plurality of magnetic input/channel regions, each of the plurality of magnetic input/channel regions being magnetically biased in a first direction;
    providing at least one magnetic sensor region being magnetically biased in a second direction different from the first direction such that at least one domain wall resides in the plurality of magnetic input/channel regions if the logic device is in a quiescent state; and
    providing at least one sensor coupled with the at least one magnetic sensor region, the at least one sensor for outputting a signal based on a magnetic state of the at least one magnetic sensor region;
    wherein the plurality of input/channel regions and the at least one magnetic sensor region are configured such that the at least one domain wall may move into the at least one magnetic sensor region in response to a logic signal being provided to at least a portion of the plurality of magnetic input regions.

16. The method of claim 15 wherein each of the plurality of magnetic input/channel regions has a corresponding input cross-sectional area and the at least one magnetic sensor region has a corresponding sensor cross-sectional area greater than the input cross-sectional area.

17. The method of claim 16 wherein the each of the plurality of magnetic input/channel regions has a first thickness and wherein the at least one sensor region has a second thickness greater than the first thickness.

18. The method of claim 15 wherein the first direction is substantially perpendicular to a plane of the plurality of magnetic input regions and wherein the second direction is antiparallel to the first direction.

19. The method of claim 15 further comprising:
providing a plurality of input electrodes corresponding to the plurality input/channel regions.

20. The method of claim 19 further comprising:
providing a ground electrode, the at least one sensor residing between the plurality of input/channel regions and the ground.

21. The method of claim 20 further comprising:
providing an additional ground electrode, the at least one sensor region residing between the additional ground electrode and the at least one sensor.

22. The method of claim 15 wherein the step of providing the at least one sensor further includes:
providing a nonmagnetic spacer layer; and
providing a pinned layer, the nonmagnetic spacer layer residing between the pinned layer and the at least one sensor region.

* * * * *